US011367507B2

(12) United States Patent
Huang et al.

(10) Patent No.: US 11,367,507 B2
(45) Date of Patent: *Jun. 21, 2022

(54) MEMORY DEVICE AND ELECTRONIC DEVICE

(71) Applicant: Taiwan Semiconductor Manufacturing Company, Ltd., Hsinchu (TW)

(72) Inventors: Chien-Yu Huang, Hsinchu (TW); Chia-En Huang, Hsinchu (TW); Cheng Hung Lee, Hsinchu (TW); Hua-Tai Shieh, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/135,043

(22) Filed: Dec. 28, 2020

(65) Prior Publication Data

US 2021/0118521 A1 Apr. 22, 2021

Related U.S. Application Data

(63) Continuation of application No. 16/509,178, filed on Jul. 11, 2019, now Pat. No. 10,878,934.

(60) Provisional application No. 62/698,640, filed on Jul. 16, 2018.

(51) Int. Cl.
*G11C 29/00* (2006.01)
*G06F 11/16* (2006.01)
*G11C 8/10* (2006.01)
*G11C 7/12* (2006.01)

(52) U.S. Cl.
CPC ........ *G11C 29/702* (2013.01); *G06F 11/1666* (2013.01); *G11C 7/12* (2013.01); *G11C 8/10* (2013.01)

(58) Field of Classification Search
CPC ........... G11C 29/702; G11C 8/10; G11C 7/12; G11C 29/806; G11C 29/781; G11C 16/0483; G11C 16/08; G11C 29/785; G11C 29/832; G06F 11/1666
USPC .................................................... 365/230.06
See application file for complete search history.

(56) References Cited

U.S. PATENT DOCUMENTS

| 5,566,128 | A | 10/1996 | Magome |
| 6,130,853 | A | 10/2000 | Wang et al. |
| 7,359,264 | B2 | 4/2008 | Kim et al. |
| 9,177,625 | B2 | 11/2015 | Ko |
| 9,293,227 | B1 | 3/2016 | Takasugi |
| 10,250,139 | B2 | 4/2019 | Wan et al. |
| 10,460,813 | B2* | 10/2019 | Park ................... G11C 11/5671 |
| 10,593,408 | B2 | 3/2020 | Park et al. |
| 10,878,934 | B2 | 12/2020 | Huang et al. |

(Continued)

FOREIGN PATENT DOCUMENTS

| CN | 104112469 A | 10/2014 |
| CN | 105895164 A | 8/2016 |

(Continued)

*Primary Examiner* — Fernando Hidalgo
(74) *Attorney, Agent, or Firm* — Merchant & Gould P.C.

(57) ABSTRACT

Different embodiments of local redundancy decoder circuits that can be used in a memory device are disclosed. The different types of local redundancy decoder circuits are operably connected to the columns of memory cells in a memory array.

20 Claims, 12 Drawing Sheets

(56) References Cited

U.S. PATENT DOCUMENTS

2017/0288542 A1   10/2017  Wan et al.
2017/0358357 A1   12/2017  Hung et al.

FOREIGN PATENT DOCUMENTS

| CN | 107507644 A | 12/2017 |
|---|---|---|
| TW | 1626658 B | 6/2018 |

* cited by examiner

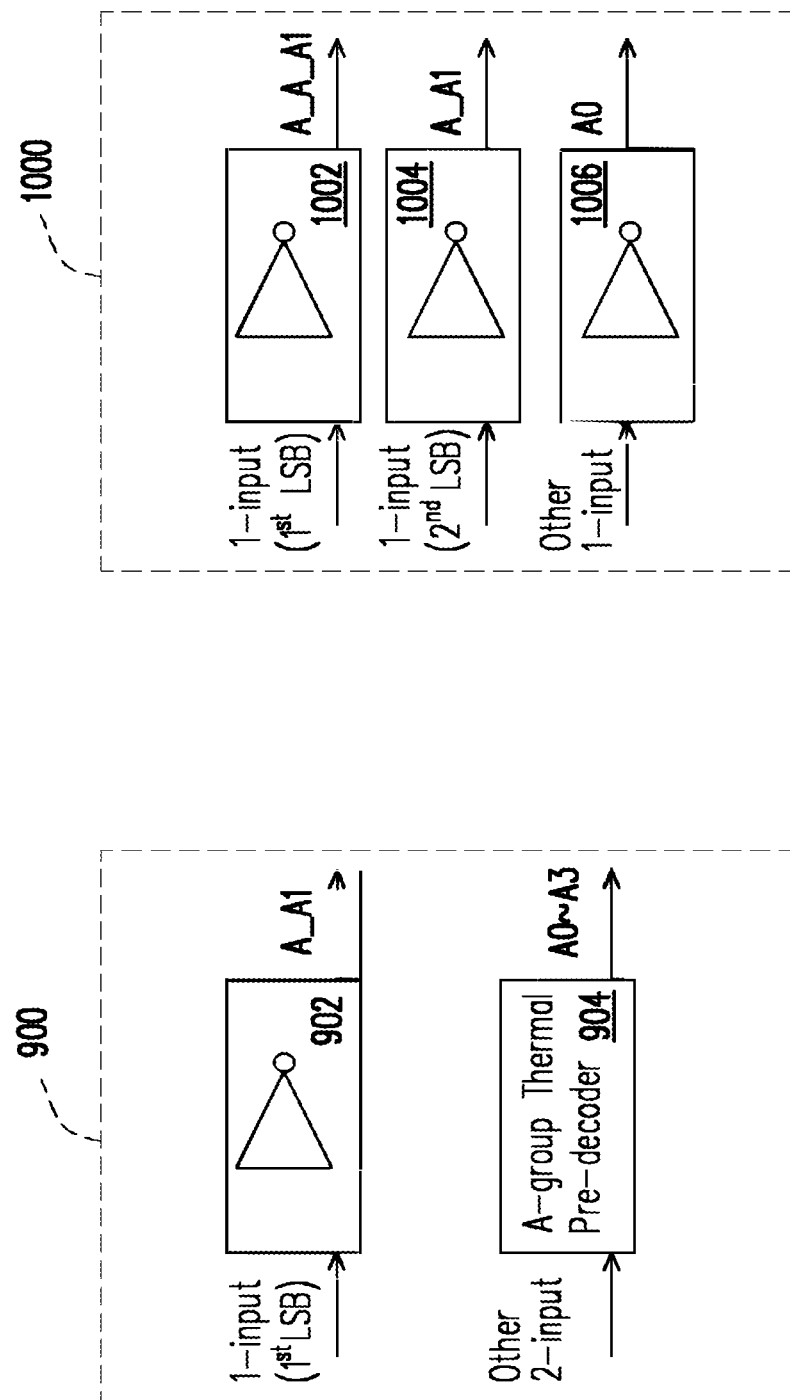

MEMORY DEVICE AND ELECTRONIC DEVICE

CROSS-REFERENCE TO RELATED APPLICATION(S)

This application is a continuation of U.S. patent application Ser. No. 16/509,178 (now U.S. Pat. No. 10,878,934) filed on Jul. 11, 2019 and entitled "MEMORY DEVICE AND ELECTRONIC DEVICE" which application claims priority to U.S. Provisional Application No. 62/698,640 entitled "MEMORY REDUNDANCY" filed on Jul. 16, 2018, of which the entire disclosures are hereby incorporated by reference in their entirety.

BACKGROUND

Memory devices are typically provided as internal storage units in computing or communication devices. In general, memory devices contain an array of memory cells arranged in rows and columns for storing data, and row and column decoder circuits coupled to the array of memory cells for accessing the array of memory cells in response to an external address. Each column of memory cells in the memory devices can be operably connected to one or more bit lines for reading data from, and writing data to, a memory cell designated by the external address.

In some instances, a memory cell in the memory array may fail or become defective. To address the possibility of a defective memory cell, a memory array is typically designed to include one or more rows and columns of redundant memory cells. The redundant memory cells are operably connected to redundant column circuits and redundant row circuits. When a memory cell fails, or when a row line or a bit line operably connected to a memory cell fails, the column or row containing the defective component is replaced with a redundant column or row of memory cells. However, some implementations of redundant column and/or row circuits include the redundant circuits in every column or row, which can consume a significant amount of area in the memory device. Additionally or alternatively, the redundant column and/or row circuits may increase leakage of the memory device.

BRIEF DESCRIPTION OF THE DRAWINGS

The disclosure will be readily understood by the following detailed description in conjunction with the accompanying drawings, wherein like reference numerals designate like structural elements, and in which:

FIG. 9 illustrates a first pre-decoder circuit in accordance with some embodiments;

FIG. 10 depicts a second pre-decoder circuit in accordance with some embodiments;

DETAILED DESCRIPTION

Figure 1:
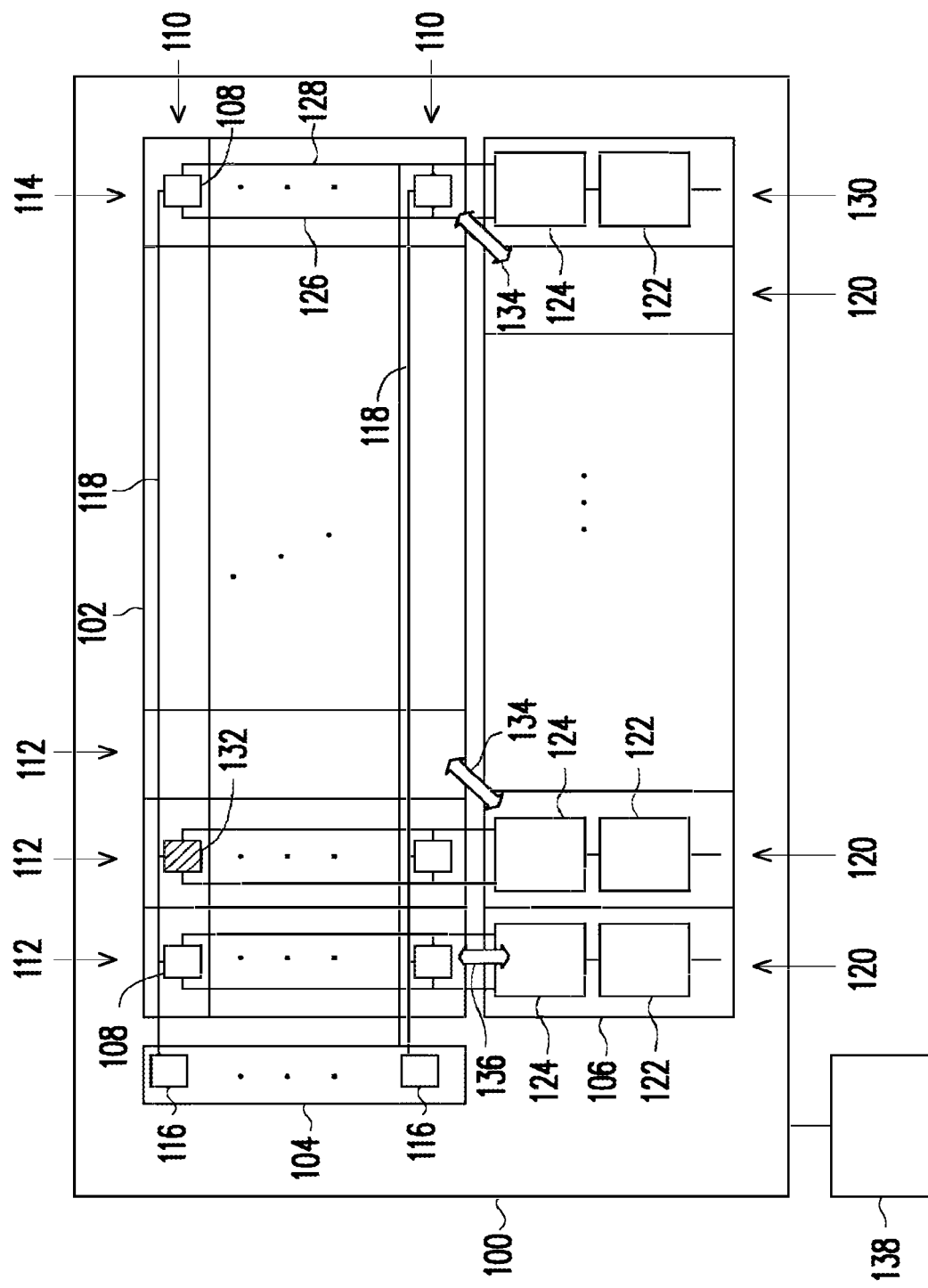
FIG. 1 is a block diagram of an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "forward", "backward" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein provide various local redundancy decoder (LRD) circuits for use in a memory device. Different types of LRD circuits are operably connected to the columns of memory cells in a memory device. The LRD circuits are grouped into sets of multiple LRD circuits. For example, in one embodiment, the LRD circuits are grouped into sets of two LRD circuits. In another embodiment, the LRD circuits are grouped into sets of four LRD circuits.

An output signal (a "HIT signal") from one LRD circuit in one set ripples to an immediately adjacent set and functions as an input signal in the immediately adjacent set. The ripple signal is used by the adjacent set in the decoding operation. Thus, embodiments described herein provide a local decoder scheme that uses data (output signals) from an adjacent set when performing a decoding operation. Additionally, in some embodiments, a bit or bits in an input signal indicating which column is to be repaired is used as an input to a LRD circuit while at least one remaining bit in the input signal is used as the input signal. The LRD circuits can be implemented with many different techniques for repairing or compensating for a defective component in the memory array (e.g., a defective memory cell). Example techniques include, but not limited to, thermal coding, binary coding, and global routing.

These and other embodiments are discussed below with reference to FIGS. 1-12. However, those skilled in the art will readily appreciate that the detailed description given herein with respect to these Figures is for explanatory purposes only and should not be construed as limiting.

FIG. 1 is a block diagram of an example memory device in accordance with some embodiments. The memory device 100 can be any suitable memory device. For example, in one embodiment, the memory device 100 is a static random access memory (SRAM) device. In another non-limiting example, the memory device is a dynamic random access memory (DRAM) device.

The memory device 100 includes a memory array 102, row circuitry 104 operably connected to the memory array 102, and column circuitry 106 operably connected to the memory array 102. The memory array 102 includes memory cells 108 arranged in rows 110 and columns 112. In the illustrated embodiment, column 114 is a redundant column that includes a column of redundant memory cells 108.

The row circuitry 104 includes driver circuits 116, where each driver circuit 116 is operably connected to one or more row lines (represented by row line 118). The column circuitry 106 includes column circuits 120 that are each comprised of a LRD circuit 122 operably connected to a read/write (R/W) circuit 124. Each R/W circuit 124 is operably connected to one or more bit lines. In the illustrated embodiment, each R/W circuit 124 is operably connected to a first bit line 126 (e.g., bl) and a second bit line 128 (e.g., blb). In the illustrated embodiment, the LRD circuit 122 and the R/W circuit 124 form a redundant column circuit 130 that is operably connected to the redundant column 114. In some instances, the redundant column circuits 130, including the LRD circuits 122, can consume a large amount of area in the memory device 100 and/or increase leakage of the memory device 100.

When a memory cell is defective (e.g., memory cell 132), the column circuitry 106 may shift the sequence of columns to adjacent column circuits 120, as shown by arrows 134 in FIG. 1. The columns that precede the shift use the original column circuits to access the memory cells in those columns (see e.g., arrow 136). In such situations, the LRDs 122 are used to access the memory cells 108 in the shifted columns 106.

A processing unit 138 can be operably connected to the memory device 100 and control some or all of the operations of the memory device 100. For example, the processing unit 138 may control the operations of the row circuitry 104, the column circuitry 106, and/or the LRD circuits 122. In other embodiments, the processing unit 138 can be located in the memory device (in the integrated circuit or chip of the memory device 100). Any suitable processing unit or units can be used. Example processing units include, but are not limited to, a microprocessor, an application specific integrated circuit, and/or a field programmable gate array.

Figure 8A:
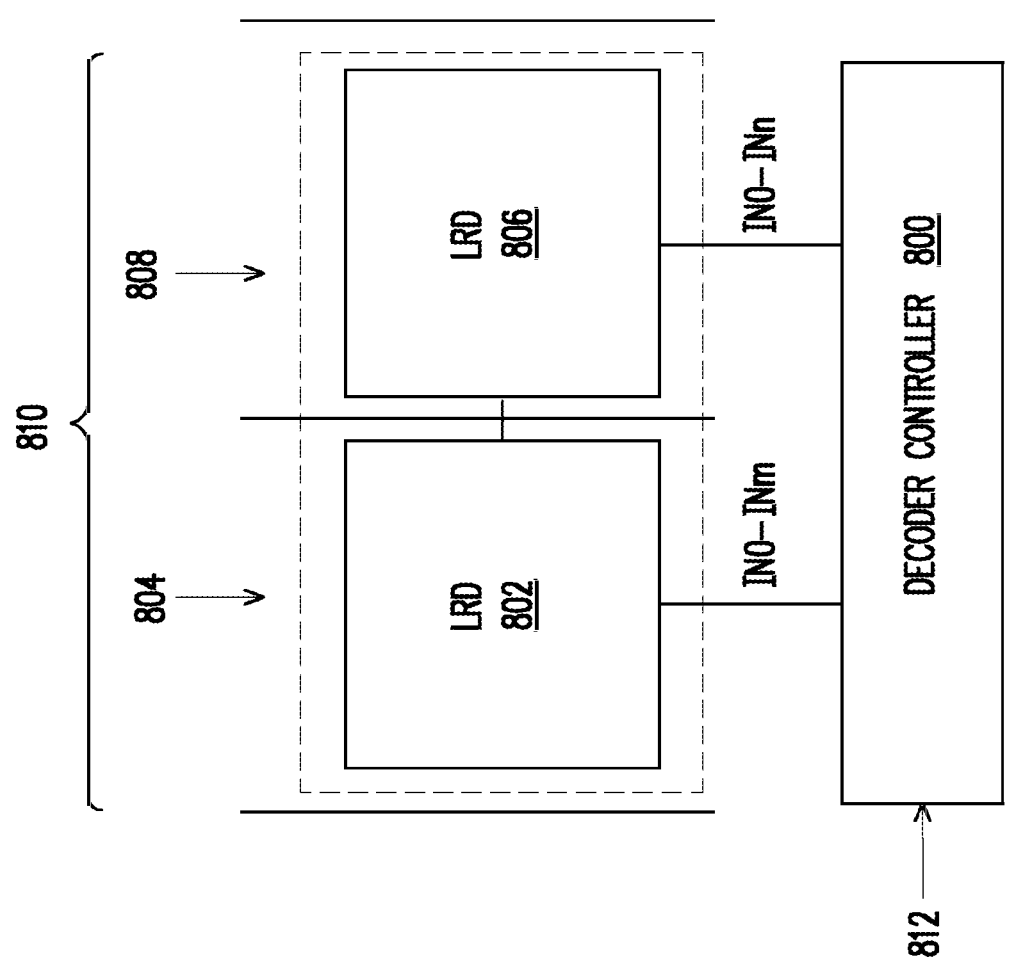
FIG. 8A illustrates a block diagram of a first example decoder controller operably connected to a set of local redundancy decoders in accordance with some embodiments.

FIG. 8A illustrates a block diagram of a first example decoder controller operably connected to a set of local redundancy decoder circuits in accordance with some embodiments. The decoder controller 800 generates and provides input signals for two LRD circuits 802, 806, although other embodiments are not limited to this configuration. The decoder controller 800 can generate input signals for one or more LRD circuits in other embodiments. Example decoder controllers include, but are not limited to, a microprocessor, an application specific integrated circuit, and/or a field programmable gate array.

The LRD circuit 802 is in column 804 and the LRD circuit 806 is in column 808. The LRD circuits 802, 806 form a set 810. As will be described in more detail later, one or more output signals from an immediately adjacent set is used as an input signal in the set 810.

The decoder controller 800 produces the input signals IN0-INm, IN0-INn based on an input signal 812. The input signal 812 includes an N-bit input signal that identifies which column is to be repaired (N equal to or greater than one). Each variable m, n is a number equal to or greater than zero. Thus, in some embodiments, a LRD circuit 802, 806 has one input signal (e.g., n=0) or multiple input signals. In one embodiment, the input signals are thermal code input signals or binary code input signals.

Figure 8B:
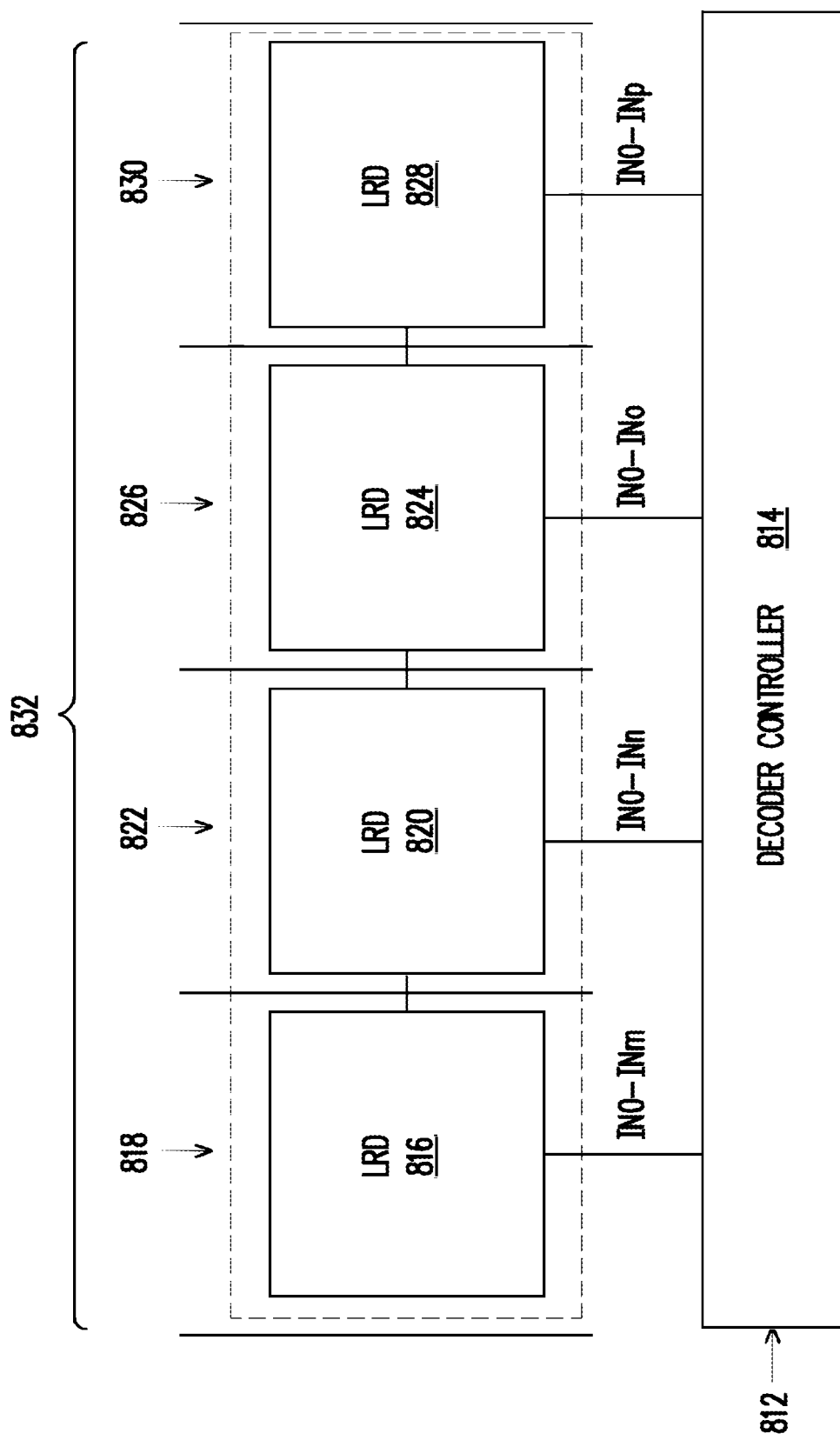
FIG. 8B depicts a block diagram of a second example decoder controller operably connected to a set of local redundancy decoders in accordance with some embodiments.

FIG. 8B depicts a block diagram of a second example decoder controller operably connected to a set of local redundancy decoder circuits in accordance with some embodiments. The illustrated decoder controller 814 generates and provides input signals for four LRD circuits 816, 820, 824, 828. The decoder controller 814 can generate input signals for one or more LRD circuits in other embodiments.

The LRD circuit 816 is in column 818, the LRD circuit 820 is in column 822, the LRD circuit 824 is in column 826, and the LRD circuit 828 is in column 830. The LRD circuits 816, 820, 824, 828 form a set 832. The input signals IN0-INm, IN0-INn, IN0-INo, IN0-INp are produced based on an input signal 812. Each variable m, n, o, p is a number equal to or greater than zero. Thus, in some embodiments, a LRD circuit 816, 820, 824, 828 has one input signal (e.g., n=0) or multiple input signals.

The input signals IN0-INm, IN0-INn can be thermal code input signals or binary code input signals. The input signals for thermal code can be based on one or more groups of signals, and these groups are known as group A, group B, group C, etc. The input signals IN0-INm, IN0-INn, IN0-INo, IN0-INp can all be associated with one group (e.g., group A) or the input signals may be a combination of signals from different groups (e.g., group A and group B). In some embodiments, which group or groups is used can impact the structure of the LRD circuits (e.g., which components are used in the LRD circuits).

Figure 2:
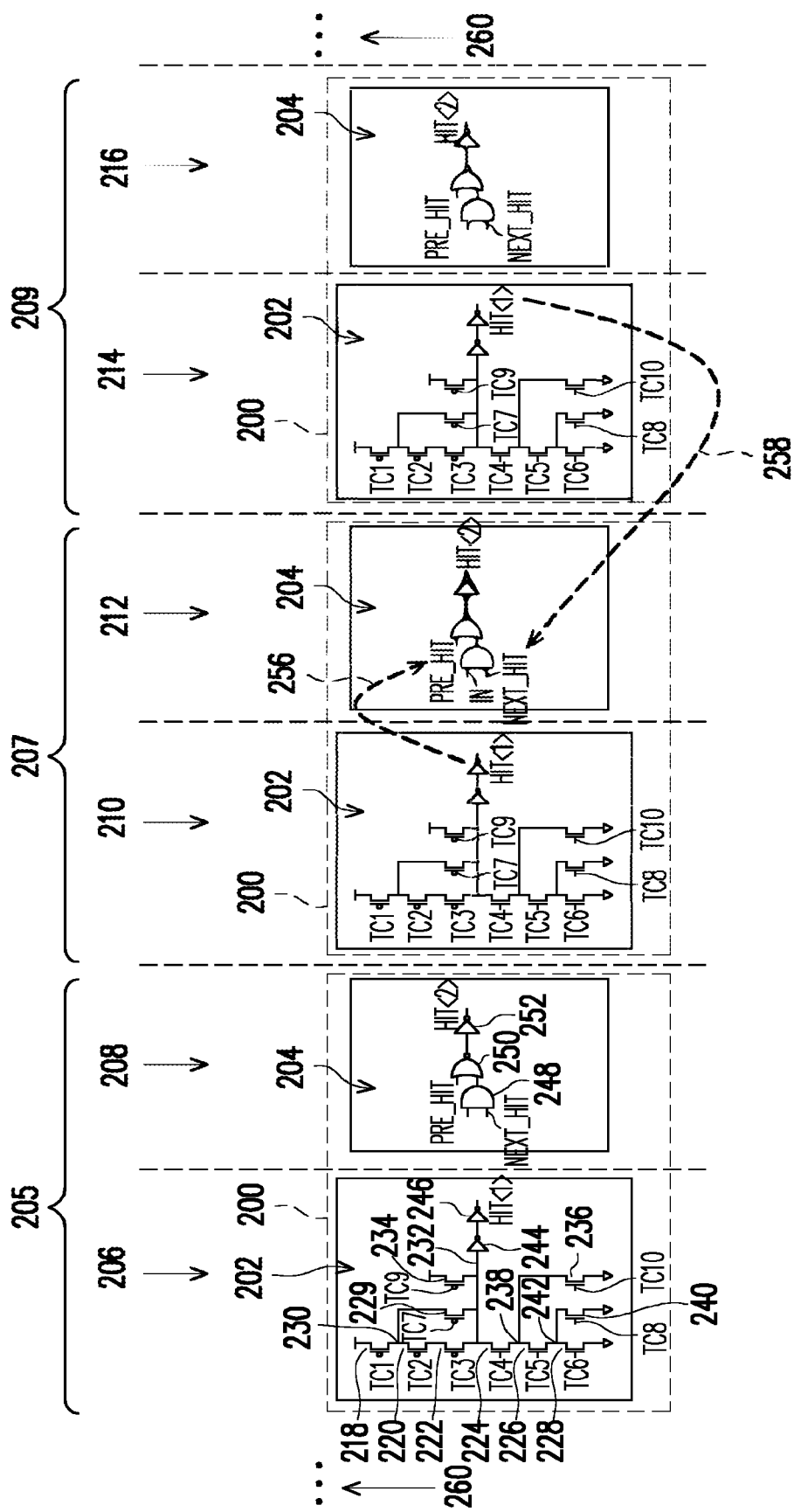
FIG. 2 illustrates first local redundancy decoder circuitry in accordance with some embodiments.

FIG. 2 illustrates first local redundancy decoder circuitry in accordance with some embodiments. The first local redundancy decoder circuitry 200 is implemented as a thermal code local redundancy decoder circuitry. The input signals TC1-TC10 represent the thermal code input signals produced by a decoder controller (e.g., decoder controller 800 in FIG. 8A). The first local redundancy decoder circuitry 200 can be implemented with thermal code input signals TC1-TC10 associated with one or more groups in thermal code (e.g., group A or a combination of groups A and B). Those skilled in the art will recognize that which group or groups is used is determined by the operation of the memory array and the input signal to the decoder controller (e.g., 1 bit input signal, 2 bit input signal, 3 bit input signal).

Each first local redundancy decoder circuitry 200 includes a first LRD circuit 202 and a second LRD circuit 204. Each pair of first and second LRD circuits 202, 204 form a set 205, 207, 209, and one or more LRD circuit output signals ("HIT signals") ripple forward and/or backward by one immediately adjacent set. The HIT signals indicate whether a column is to be repaired. In a non-limiting embodiment, a column is identified as a repair when the HIT signal is a 1 and identified as a non-repair when the HIT signal is 0.

In the illustrated embodiment, the first LRD circuits 202 are located in alternating columns 206, 210, 214 (e.g., every other column) and the second LRD circuits 204 are positioned in alternating columns 208, 212, 216. For example, a first LRD circuit 202 can be included in column 0, column 2, and column 4 (the even numbered columns) and a second LRD circuit 204 may be included in column 1, column 3, and column 5 (the odd numbered columns). Although only six columns are shown, other embodiments can include any number of columns.

Each first LRD circuit 202 is a combinational logic circuit that includes two OR circuits and one NAND circuit. In the illustrated embodiment, the OR-NAND circuit structure includes a first transistor 218, a second transistor 220, a third transistor 222, a fourth transistor 224, a fifth transistor 226, and a sixth transistor 228 operably connected in series between a voltage supply (e.g., VDD) and a reference voltage (e.g., ground), a seventh transistor 229 operably connected between a node 230 (between the first and the second transistors 218, 220) and a node 232 (between the third and the fourth transistors 222, 224), an eighth transistor 234 operably connected between the voltage supply and node 232, a ninth transistor 236 operably connected between a node 238 (between the fourth and the fifth transistors 224, 226) and the reference voltage, and a tenth transistor 240 operably connected between a node 242 (between the fifth and the sixth transistors 226, 228) and the reference voltage. Two inverters 244, 246 are connected in series between the node 232 and an output. As shown in the example embodiment of FIG. 2, the first, second, third, seventh, and eighth transistors 218, 220, 222, 229, 234 are PMOS transistors and the fourth, fifth, sixth, ninth, and tenth transistors 224, 226, 228, 236, 240 are NMOS transistors, although other embodiments are not limited to this implementation.

The second LRD circuit 204 is also a combinational logic circuit that includes the output of an AND circuit 248 operably connected to a first input of a NOR circuit 250 and an inverter 252 operably connected to an output of the NOR circuit 250.

As shown in FIG. 2, an output signal (a "HIT signal") in a set can ripple to an immediately adjacent set and function as an input signal in the immediately adjacent set. In this manner, the output signal from the immediately adjacent set is used in a decoding operation. The LRD circuits 202, 204 having an output signal that will ripple are determined based on which column is identified as a repair.

For example, when column 210 is to be repaired, the input IN of the AND circuit 248 in column 210 is 1 and the output signal HIT<1> in column 214 will ripple to the input NEXT_HIT of the AND circuit 248 in the LRD circuit 204 in column 212 (ripple represented by arrow 258). The term "NEXT_HIT" is used to indicate the input signal is an output signal from a succeeding LRD circuit (e.g., a LRD circuit to the right or a higher numbered column). Similarly, although not shown in FIG. 2, the output signal from the LRD circuit 202 in column 218 will ripple to the NEXT_HIT input of the NAND circuit 248 in column 216, the output signal from the LRD circuit 202 in column 222 will ripple to the NEXT_HIT input of the NAND circuit 248 in column 220, and so on in the columns that succeed column 210 (succeeding columns indicated by ellipsis 260).

In the example embodiment shown in FIG. 2, an output signal from a LRD circuit 202, 204 ripples forward as well, but this ripple is within a set 205, 207, 209. The output signal from a LRD circuit 202 ripples to the LRD circuit 204 in the same set and functions as an input signal to the NOR circuit 250. Thus, the output signal from a LRD circuit 202 is used by the LRD circuit 204 in a decoding operation. For example, when column 210 is to be repaired, the output signal HIT<1> in column 210 will ripple to the input PRE_HIT of the NOR circuit 250 in the LRD circuit 204 in column 212 (ripple represented by arrow 256). The term "PRE_HIT" is used to indicate the input signal is an output signal from a preceding LRD circuit (e.g., a LRD circuit to the left or a lower numbered column). Similarly, although not shown in FIG. 2, the output signal from the LRD circuit 202 in column 214 will ripple to the PRE_HIT input of the NOR circuit 250 in column 216, the output signal from the LRD circuit 202 in column 218 will ripple to the PRE_HIT input of the NOR circuit 250 in column 220, and so on in the columns that succeed column 210.

Figure 3:
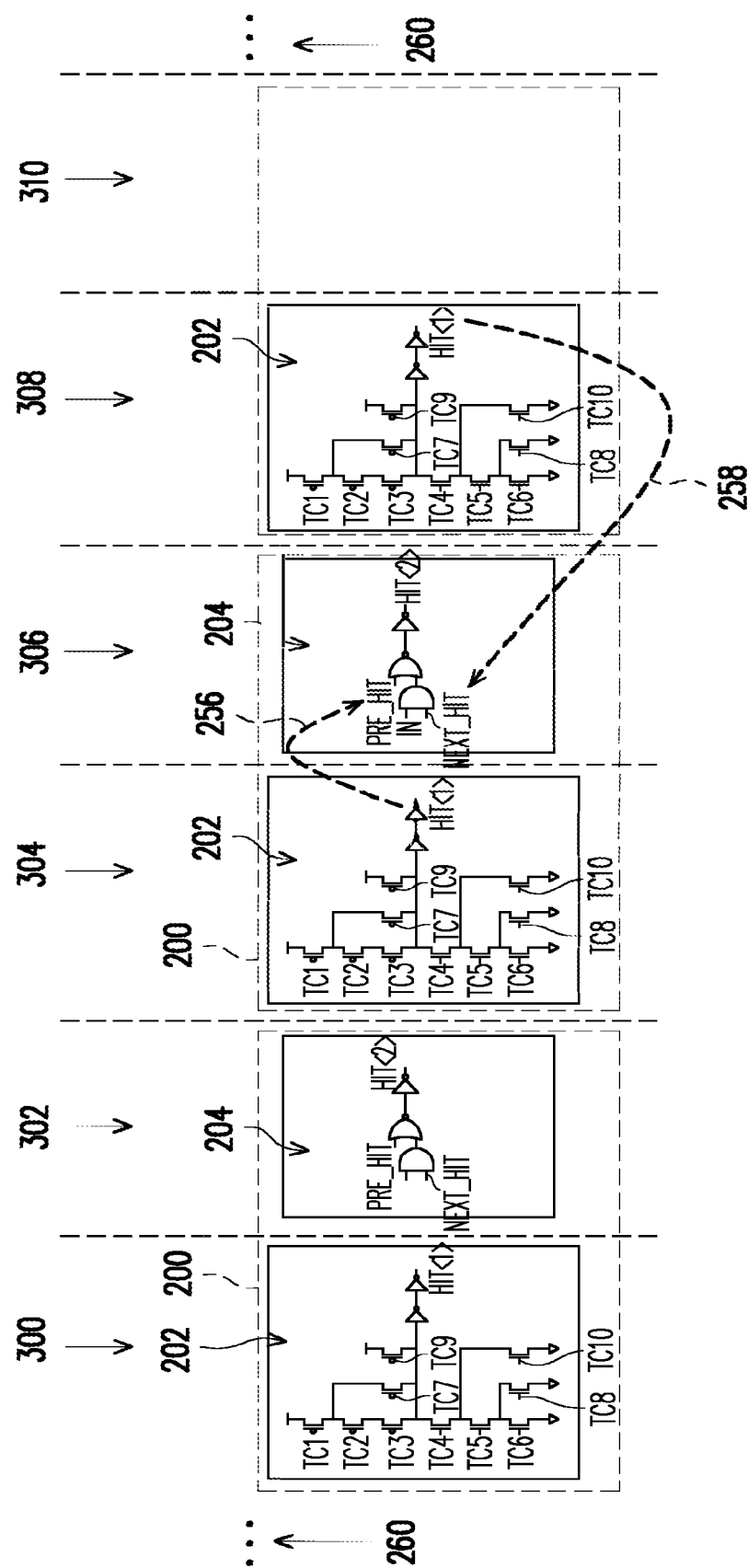
FIG. 3 depicts alternative second local redundancy decoder circuitry in accordance with some embodiments.

FIG. 3 depicts an alternative first local redundancy decoder circuitry in accordance with some embodiments. When the total number of columns in a memory array is an odd number N, a LRD circuit is not included in the last column N. For example, as shown in FIG. 3, a second LRD circuit 204 is not implemented in column 310.

The different types of LRD circuits in FIGS. 2 and 3 include different numbers of components and/or types of components. For example, the first LRD circuit 202 includes fourteen components (e.g., transistors) and the second LRD circuit 204 includes an AND circuit, a NOR circuit, and an inverter (or eight transistors).

Figure 4:
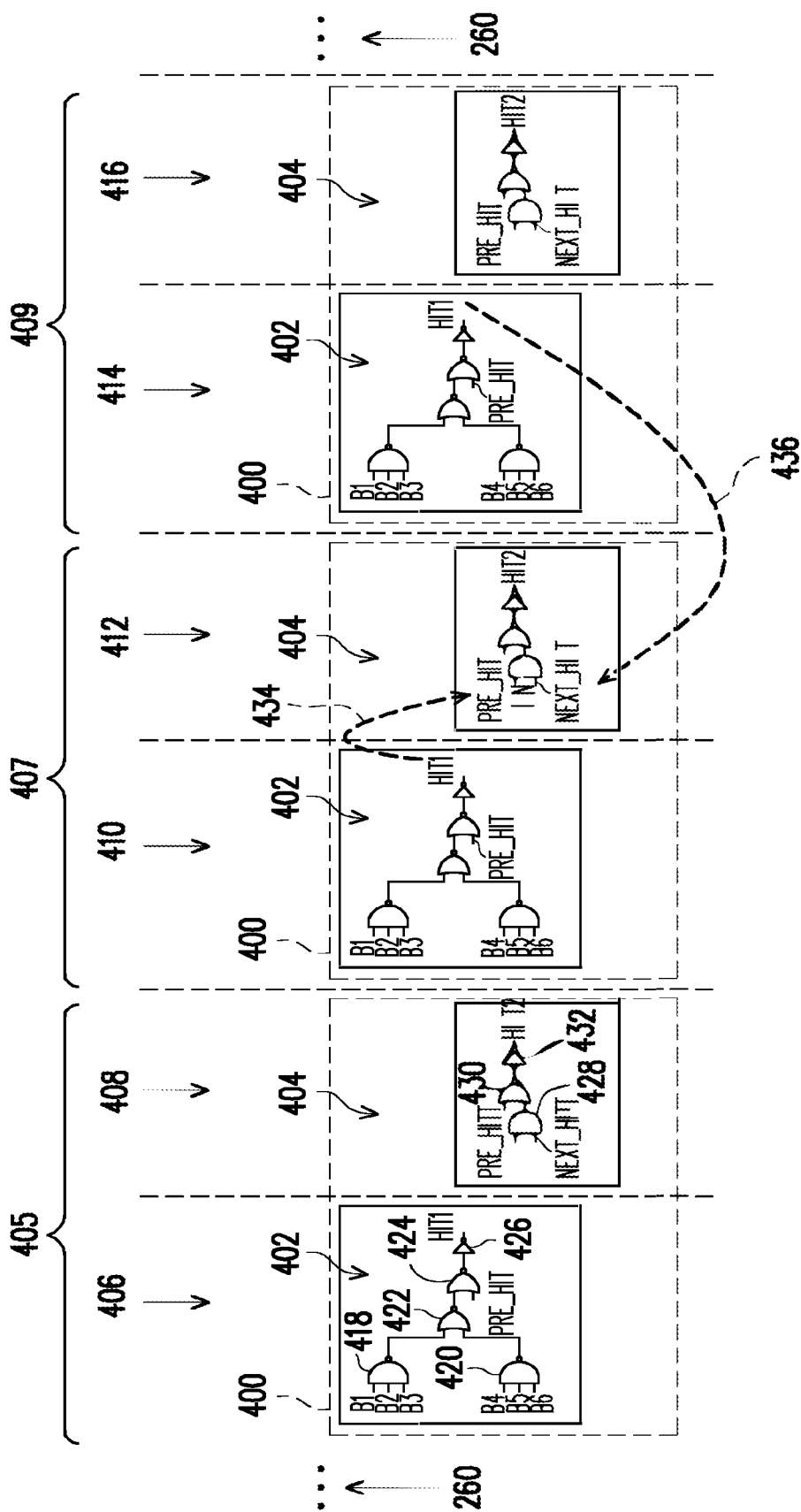
FIG. 4 illustrates second local redundancy decoder circuitry in accordance with some embodiments.

FIG. 4 depicts second local redundancy decoder circuitry in accordance with some embodiments. Each second local redundancy decoder circuitry 400 includes a first LRD circuit 402 and a second LRD circuit 404. Each pair of first and second LRD circuits 402, 404 form a set 405, 407, 409, and one or more output signals only ripple forward and/or backward to an immediately adjacent set. In the illustrated embodiment, the second local redundancy decoder circuitry 400 is implemented as a binary code local redundancy decoder circuitry. As such, the input signals B1-B6 represent the binary code input signals produced by a decoder controller (e.g., decoder controller 800 in FIG. 8A).

In the illustrated embodiment, the first LRD circuits 402 are located in alternating columns 406, 410, 414 (e.g., every other column) and the second LRD circuits 404 are positioned in alternating columns 408, 412, 416. For example, a first LRD circuit 402 can be included in column 0, column 2, and column 4 (the even numbered columns) and a second LRD circuit 404 may be included in column 1, column 3, and column 5 (the odd numbered columns). Although only six columns are shown, other embodiments can include any number of columns.

The first LRD circuit 402 is a combinational logic circuit that includes the outputs of two NAND circuits 418, 420 input into a first NOR circuit 422. The output of the first NOR circuit 422 is input to a first input of a second NOR circuit 424. A PRE_HIT signal is input to the second input of the second NOR circuit 424. The output of the second NOR circuit 424 is an input into an inverter 426.

The second LRD circuit 404 includes the output of an AND circuit 428 operably connected to a first input of a NOR circuit 430. An inverter 432 operably connected to an output of the NOR circuit 430. The second input to the NOR circuit 430 is an output signal that has rippled from a preceding set (PRE_HIT).

As shown in FIG. 4, a first output signal HIT1 in a set can ripple back to an immediately adjacent set and function as an input signal in the immediately adjacent set. In this manner, the output signal from the immediately adjacent set is used in a decoding operation. Additionally, a second output signal within a set can ripple forward from the LRD circuit 402 to the LRD circuit 404. The LRD circuits 402, 404 having an output signal that will ripple are determined based on which column is identified as a repair.

For example, when column 412 is identified as a column to be repaired, the input signal IN of the AND circuit 428 in column 412 is 1 and the output signal HIT1 in the first LRD circuit 402 in column 410 ripples forward and functions as the input signal PRE_HIT to the NOR circuit 430 in the second LRD circuit 404 in column 412 (ripple represented by arrow 434). Additionally, the output signal HIT1 in the first LRD circuit 402 in column 414 ripples back and functions as the input signal NEXT_HIT to the NAND circuit 428 in the second LRD circuit 404 in column 412 (ripple represented by arrow 436). Thus, the output signal HIT1 ripples forward within a set (e.g., within set 407) and the output signal HIT1 ripples backward only one set (e.g., from set 409 to set 407).

Additionally, when column 412 is the column to be repaired, the output signal HIT1 from the LRD circuit 402 in column 414 will ripple to the PRE_HIT input of the NOR circuit 430 in column 416 (not shown), the output signal from the LRD circuit 402 in column 418 will ripple to the PRE_HIT input of the NOR circuit 430 in column 220 (not shown), and so on in the columns that succeed column 410 (succeeding columns indicated by ellipsis 260). Similarly, although not shown in FIG. 4, the output signal HIT1 from the LRD circuit 402 in column 418 will ripple back to the NEXT_HIT input of the NAND circuit 428 in column 416, the output signal HIT1 from the LRD circuit 402 in column 422 will ripple to the NEXT_HIT input of the NAND circuit 428 in column 420, and so on in the columns that succeed column 210.

The different types of LRD circuits in FIG. 4 include different numbers of components and/or types of components. For example, the first LRD circuit 402 includes two NAND circuits, two NOR circuits, and an inverter and the second LRD circuit 404 includes an AND circuit, a NOR circuit, and an inverter.

In some embodiments, a code scheme is converted to a different code scheme. In a non-limiting example, a 3-8 thermal code scheme is converted to a 2-4 thermal code scheme. A memory device can include fewer routing lines when the code scheme is converted from a higher signal code scheme (e.g., 3-8) to a lower signal code scheme (e.g., 2-4). Additionally or alternatively, the LRD circuits may be less complex when the code scheme is converted from a higher signal code scheme (e.g., 3-8) to a lower signal code scheme.

In one embodiment, some of the bits in the input signal (e.g., input signal 812 in FIG. 8) are used as input signals in the LRD circuits and the remaining bit(s) is used to convert the binary code or thermal code scheme to a different scheme. For example, with a three bit input signal, the least significant bit can be used as an input signal in a LRD circuit and the remaining two bits used to convert a 3-8 thermal code scheme to a 2-4 thermal code scheme. Transitioning a bit in the input signal to an input signal in a LRD circuit and scheme conversion are performed with pre-decoder circuits in some embodiments.

FIG. 9 illustrates a first pre-decoder circuit in accordance with some embodiments. The pre-decoder circuit 900 is configured to convert a 3-8 code scheme to a 2-4 code scheme. Operation of the pre-decoder circuit 900 is described in conjunction with a three bit thermal code input signal. The pre-decoder circuit 900 includes a first inverter 902 and a converter circuit 904. The least significant bit of the three bit input signal is input into the inverter 902 and produces an output signal A_A1. As will be described in more detail in conjunction with FIG. 5, the output signal A_A1 is used as an input signal A_A1 in a LRD circuit.

The remaining two bits of the three bit input signal are input into the converter circuit 904 and produce output signals A0, A1, A2, and A3. The two remaining bits in the three bit input signal are used to convert the 3-8 thermal code scheme to a 2-4 thermal code scheme that includes the output signals A0, A1, A2, and A3. In one embodiment, the pre-decoder circuit 900 is implemented in the decoder controller (e.g., decoder controller 800 in FIG. 8A). In other embodiments, the pre-decoder circuit 900 is used with the binary code and the output signals A0, A1, A2, and A3 convert a 3-8 binary code scheme into a 2-4 binary code scheme.

FIG. 10 depicts a second pre-decoder circuit in accordance with some embodiments. The pre-decoder circuit 1000 is configured to convert a 3-8 code scheme to a 1-2 code scheme. Operation of the pre-decoder circuit 1000 is described in conjunction with a three bit thermal code input signal. The pre-decoder circuit includes a first inverter 1002, a second inverter 1004, and a converter circuit 1006. The first least significant bit of the three bit input signal is input into the inverter 1002 and produces an output signal A_A_A1. The second least significant bit of the three bit input signal is input into the inverter 1004 and produces an output signal A_A1. As will be described in more detail later in conjunction with FIG. 6, the output signals A_A1 and A_A_A1 are used as input signals A_A1 and A_A_A1 in several LRD circuits.

The remaining bit of the three bit input signal is input into the converter circuit 1006 and produces output signal A0. The remaining bit in the three bit input signal is used to convert the 3-8 thermal code scheme to a 1-2 thermal code scheme that includes the output signal A0. In one embodiment, the pre-decoder circuit 1000 is implemented in the decoder controller (e.g., decoder controller 814 in FIG. 8B). In other embodiments, the pre-decoder circuit 1000 is used with the binary code and the output signals A0, A1, A2, and A3 convert a 3-8 binary code scheme into a 3-6 binary code scheme.

Figure 5:
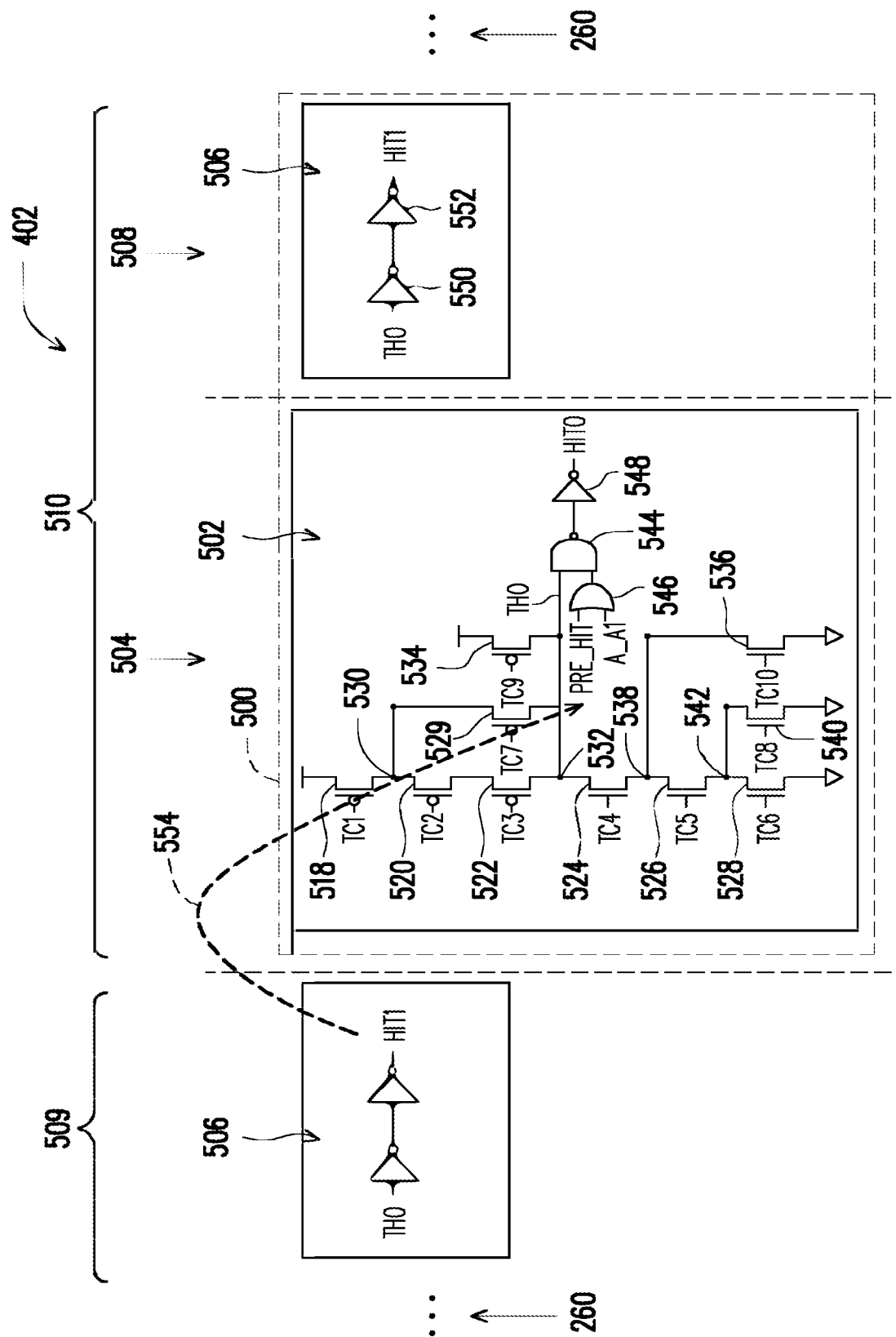
FIG. 5 illustrates third local redundancy decoder circuitry in accordance with some embodiments.

FIG. 5 depicts third local redundancy decoder circuitry in accordance with some embodiments. The FIG. 5 embodiment uses thermal coding and represents the LRD circuits and input signals when the 3-8 thermal code scheme is converted to a 2-4 thermal code scheme. Additionally, one of the output signals is used as an input signal in a LRD circuit. In the illustrated embodiment, the thermal code scheme is converted from a 3-8 thermal code scheme to a 2-4 thermal code scheme.

The input signals TC1-TC10 represent the thermal code input signals produced by a decoder controller (e.g., decoder controller 800 in FIG. 8A). The local redundancy decoder circuitry 500 can be implemented with input signals TC1-TC10 associated with one or more groups in thermal code (e.g., group A or a combination of groups A and B). Those skilled in the art will recognize that which group or groups is used is determined by the operation of the memory array and the input signal to the decoder controller (e.g., 1 bit input signal, 2 bit input signal, 3 bit input signal).

The third local redundancy decoder circuitry 500 includes a first LRD circuit 502 in column 504 and a second LRD circuit 506 in column 508. The first and the second LRD circuits 502, 506 form a set 510. Although only one complete set 510 is shown in FIG. 5, embodiments can include any number of sets (represented by ellipsis 260). For example, a second set 509 of the first and the second LRD circuits 502, 506 can be immediately adjacent the set 510 (only the second LRD circuit 506 in set 509 is shown in FIG. 5). One or more output signals of a LRD circuit 502, 506 in a set ripple forward and/or backward by only one immediately adjacent set and function as an input signal in the immediately adjacent set.

In some embodiments, the first LRD circuit 502 can be located in alternating columns (e.g., every other column) and the second LRD circuit 506 may be positioned in alternating columns. For example, the first LRD circuit 502 can be included in column 0, column 2, and column 4 (the even numbered columns) and the second LRD circuit 506 may be included in column 1, column 3, and column 5 (the odd numbered columns). Although only three columns are shown in FIG. 5, other embodiments can include any number of columns.

The first LRD circuit 502 is a combinational logic circuit that includes a first transistor 518, a second transistor 520, a third transistor 522, a fourth transistor 524, a fifth transistor 526, and a sixth transistor 528 operably connected in series between a voltage supply (e.g., VDD) and a reference voltage (e.g., ground), a seventh transistor 529 operably connected between the node 530 (between the first and the second transistors 518, 520) and the node 532 (between the third and the fourth transistors 522, 524), an eighth transistor 534 operably connected between the voltage supply and node 532, a ninth transistor 536 operably connected between a node 538 (between the fourth and the fifth transistors 524, 526) and the reference voltage, and a tenth transistor 540 operably connected between a node 542 (between the fifth and the sixth transistors 526, 528) and the reference voltage. The THO signal at node 532 is a first input to NAND circuit 544. The signal THO represents a common signal (the same signal) that is in both LRD circuits 502, 506. The second input to NAND circuit 544 is an output of the OR circuit 546. The first input to the OR circuit 546 is a PRE_HIT signal and the second input to the OR circuit 546 is an A_A1 signal. As described previously, the A_A1 signal is an inverted signal of the least significant bit of the original three bit input signal (input into pre-decoder circuit 900 in FIG. 9).

An inverter 548 is operably connected to the output of NAND circuit 544. As shown in the example embodiment of FIG. 5, the first, second, third, seventh, and eighth transistors 518, 520, 522, 529, 534 are PMOS transistors and the fourth, fifth, sixth, ninth, and tenth transistors 524, 526, 528, 536, 540 are NMOS transistors, although other embodiments are not limited to this configuration.

The second LRD circuit 506 is a combinational logic circuit that includes two inverters 550, 552 operably connected in series. As shown in FIG. 5, an output signal in a set can ripple forward to an immediately adjacent set. For example, when column 504 is identified as a column to be repaired, the output signal HIT1 in the second LRD circuit 506 in the set 509 can ripple forward and function as the PRE_HIT input signal to the OR circuit 546 in the LRD circuit 502 in column 504 of the set 510 (ripple represented by arrow 554).

The output signals HIT1 in the second LRD circuits 506 in the columns that succeed the column 504 also ripple to corresponding immediately adjacent sets. For example, the output signal HIT1 in the second LRD circuit 506 in the succeeding set 512 ripples forward and functions as the PRE_HIT input signal to the OR circuit 546 in the LRD circuit 502 in the succeeding set 514 (not shown in FIG. 5).

The different types of LRD circuits in FIG. 5 include different numbers of components and/or types of components. For example, the first LRD circuit 502 includes multiple PMOS and NMOS transistors, an OR circuit, a NAND circuit, and an inverter (e.g., eighteen transistors), and the second LRD circuit 506 includes two inverters (e.g., four transistors).

Figure 6:
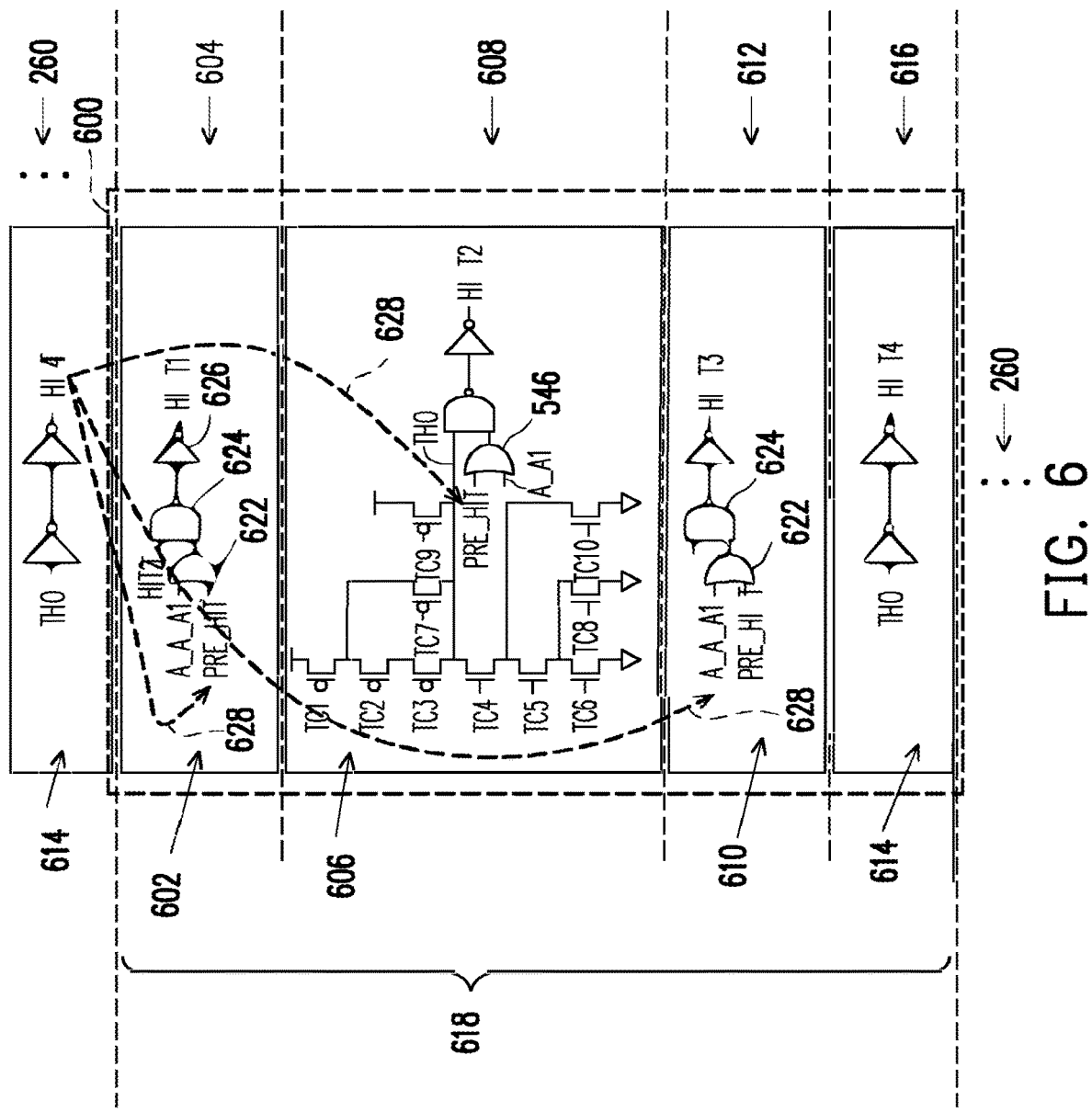
FIG. 6 illustrates fourth local redundancy decoder circuitry in accordance with some embodiments.

FIG. 6 illustrates fourth local redundancy decoder circuitry in accordance with some embodiments. The FIG. 6 embodiment uses thermal coding and represents the LRD circuits and input signals when the 3-8 thermal code scheme is converted to a 1-2 thermal code scheme. The first least significant bit (LSB) (e.g., A_A_A1) and the second LSB (e.g., A_A1) of the original three bit input signal are used as inputs in the local redundancy decoder circuitry (see e.g., FIG. 10).

The fourth local redundancy decoder circuitry 600 includes a first LRD circuit 602 in column 604, a second LRD circuit 606 in column 608, a third LRD circuit 610 in column 612, and a fourth LRD circuit 614 in column 616. The first, second, third, and fourth LRD circuits 602, 606, 610, 612 form a set 618. Although only one set is shown, embodiments can include any number of sets (indicated by ellipsis 260). One or more output signals from a LRD decoder ripple forward and/or backward only by one immediately adjacent set and function as input signals in the immediately adjacent set.

In some embodiments, the first, second, third, and fourth LRD circuits 602, 606, 610, 614 can be located in every $4^{th}$ column. For example, the first LRD circuit 602 can be included in column 0, column 4, and column 8, the second LRD circuit 606 may be positioned in column 1, column 5, and column 9, the third LRD circuit 610 can be included in column 2, column 6, and column 10, and the fourth LRD circuit 614 may be included in column 3, column 7, and column 11. Although only four columns are shown in FIG. 6, other embodiments can include any number of columns.

The first LRD circuit 602 includes an output of an OR circuit 622 operably connected to a first input of a NAND circuit 624. The first input signal to the OR circuit 622 is a PRE_HIT signal and the second input to the OR circuit 622 is a signal A_A_A1. An inverter 626 is operably connected to the output of NAND circuit 624. As described previously, the A_A_A1 signal is an inverted signal of the first LSB of the original input signal (e.g., see FIG. 10).

The components in the second LRD circuit 606 are the same as the components in the first LRD circuit 502 in FIG. 5. However, some of the signals in the second LRD circuit 606 are different from the signals in the first LRD circuit 502. The signal PRE_HIT is input to the first input of the OR circuit 546 and the signal A_A1 is input to the second input of the OR circuit 546. In the illustrated embodiment, the A_A1 signal is an inverted signal of the second LSB of the original three bit input signal (e.g., see FIG. 10).

The components in the third LRD circuit 610 are the same as the components in the first LRD circuit 602. The components in the fourth LRD circuit 614 are the same as the components in the second LRD circuit 506 in FIG. 5.

As shown in FIG. 6, an output signal in a set can ripple forward to an immediately adjacent set and function as an input signal in that immediately adjacent set. For example, the output signal HIT4 in the fourth LRD circuit 614 in an immediately adjacent set (complete set not shown at top of 600) can ripple forward as the input signal PRE_HIT to the OR circuit 622 in the first LRD circuit 602, as the input signal PRE_HIT to the OR circuit 546 in the second LRD circuit 606, and as the input signal PRE_HIT to the OR circuit 622 in the third LRD circuit 610 (ripple represented by arrows 628). Additionally, the A_A1 input to the OR circuit 546 in the second LRD circuit 606 is an inverted first LSB bit of a 3-input of a group (e.g., the A group) in the thermal coding signals. The A_A_A1 input to the OR circuit 622 in the first and the third LRD circuits 602, 610 is the inverted first LSB bit of the original three bit input signal.

The different types of LRD circuits in FIG. 6 include different numbers of components and/or types of components. For example, the first LRD circuit 602 includes an OR circuit, a NAND circuit, and an inverter (e.g., eight transistors), the second LRD circuit 606 includes multiple PMOS and NMOS transistors, an OR circuit, a NAND circuit, and an inverter (e.g., eighteen transistors), and the fourth LRD circuit 614 includes two inverters (e.g., four transistors).

Figure 7:
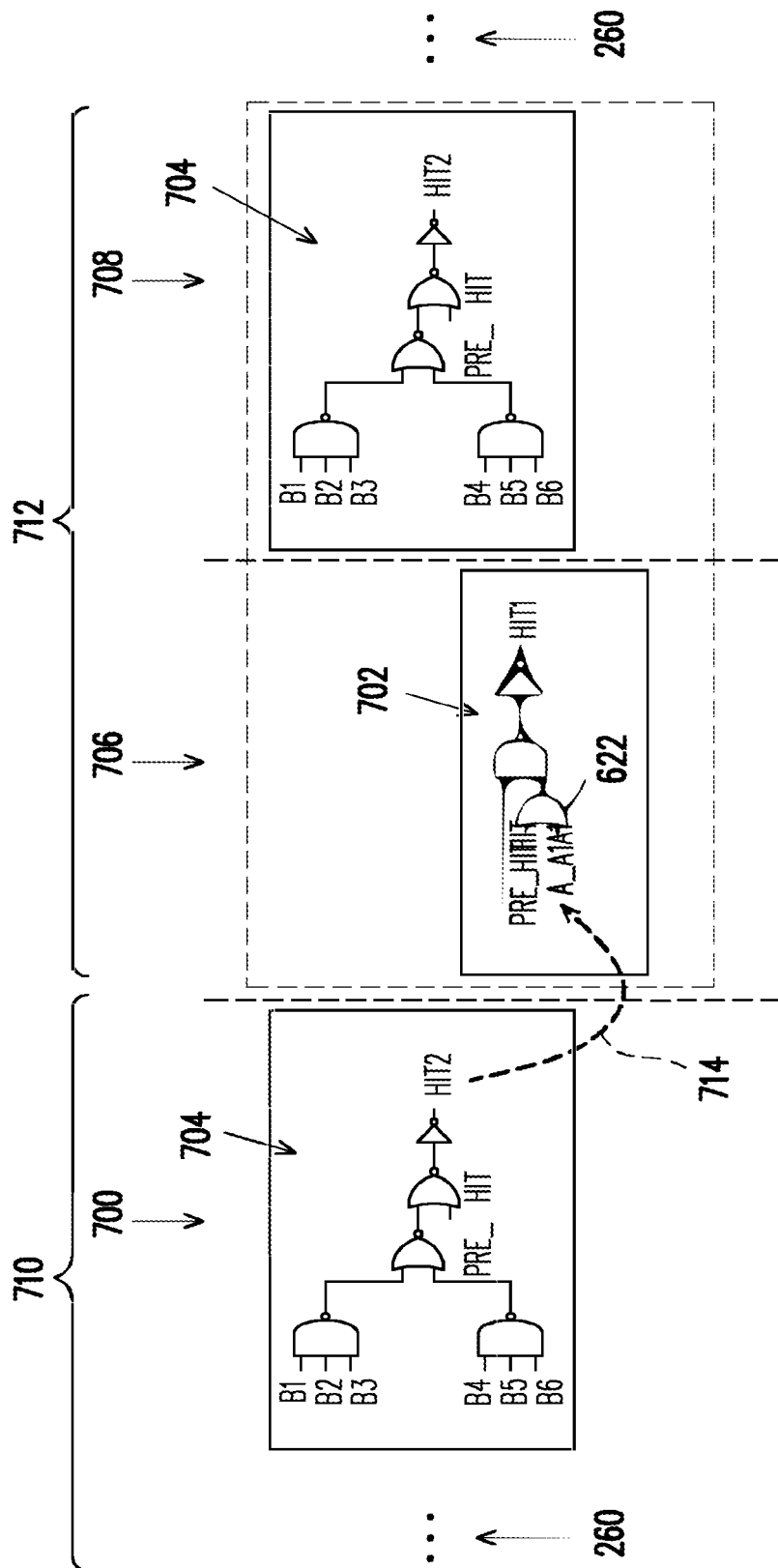
FIG. 7 illustrates fifth local redundancy decoder circuitry in accordance with some embodiments.

FIG. 7 depicts fifth local redundancy decoder circuitry in accordance with some embodiments. The FIG. 7 embodiment uses binary coding signals, and the binary code scheme is converted from a 2-4 binary code scheme to a 1-2 binary code scheme. For example, the first LSB of the original two bit input signal is used as an input signal in the local redundancy decoder circuitry (e.g., using pre-decoder circuit 900 in FIG. 9).

A second LRD circuit 704 is included in column 700, a first LRD circuit 702 is included in column 706, and the second LRD circuit 704 is included in column 708. The second LRD circuit 704 in column 700 is part of a first set 710 and the first and the second LRD circuits 702, 704 in columns 706, 708, respectively, form a second set 712. One or more output signals ripple forward and/or backward by only one immediately adjacent set and function as an input signal in the immediately adjacent set.

The components in the first LRD circuit 702 are the same as the components in the first LRD circuit 402 in FIG. 4. The components in the second LRD circuit 704 are the same as the components in the first LRD circuit 602 in FIG. 6. However, some of the signals in the first LRD circuit 702 differ from the signals in the first LRD circuit 602. The input signal PRE_HIT is input to the first input of the OR circuit 622 and the signal A_A1 is input into the second input of the OR circuit 622. As described previously, the A_A1 signal is an inverted signal of the least significant bit of the original two bit input signal (e.g., see FIG. 9).

As shown in FIG. 7, when the column 706 is identified as a repair, the output signal HIT2 in the second LRD circuit 704 in the set 710 can ripple forward as the input signal PRE_HIT in the first LRD circuits 702 in the column 706 of the immediately adjacent set 712 (ripples represented by arrow 714).

The different types of LRD circuits in FIG. 7 include different numbers of components and/or types of components. For example, the first LRD circuit 700 includes two NAND circuits, two NOR circuits, and an inverter and the second LRD circuit 704 includes an OR circuit, a NAND circuit, and an inverter.

Figure 11:
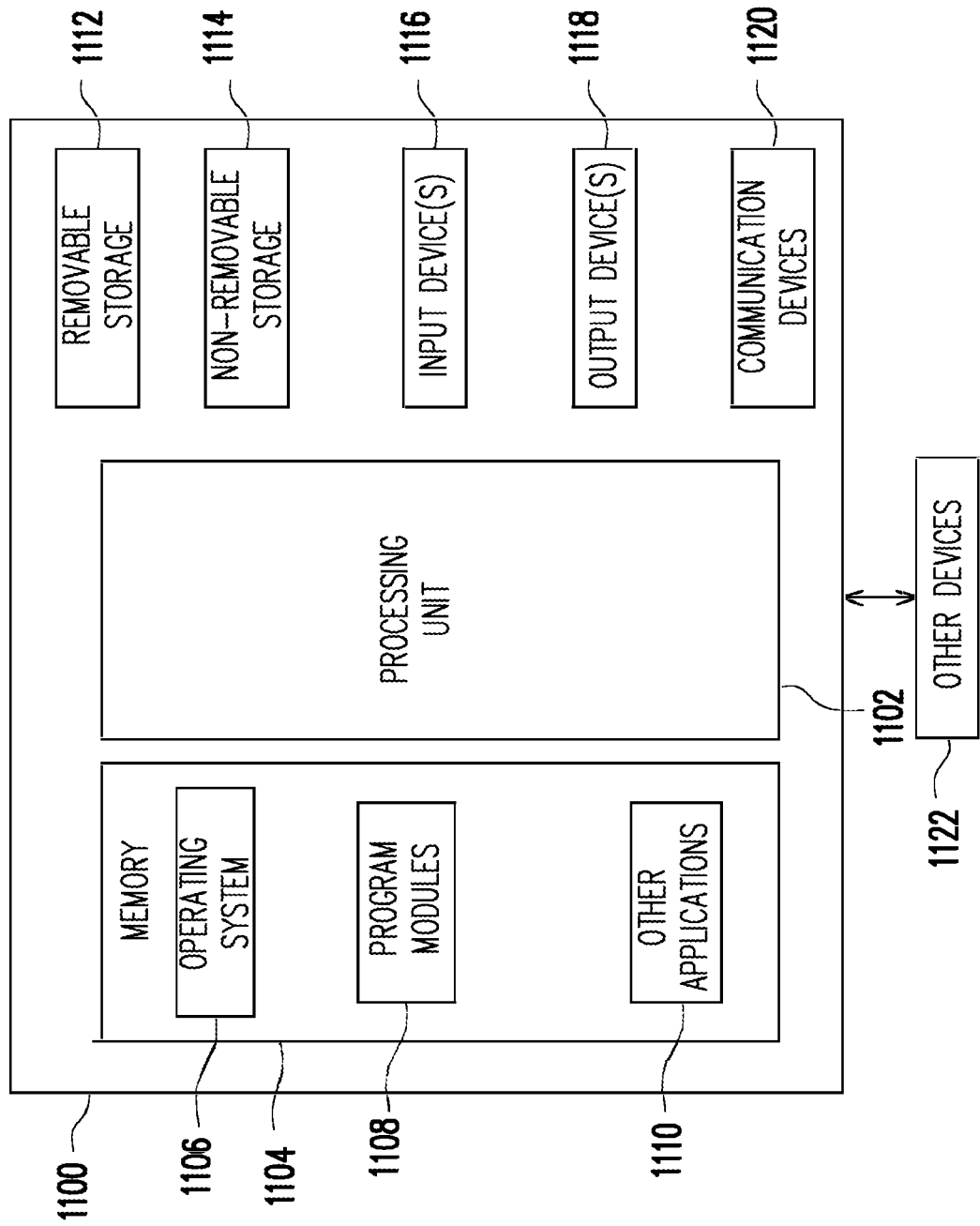
FIG. 11 illustrates a block diagram of an electronic device in which aspects of the disclosure may be practiced in accordance with some embodiments.

FIG. 11 depicts a block diagram of an electronic device with which aspects of the disclosure may be practiced in accordance with some embodiments. In a basic configuration, the electronic device 1100 may include at least one processing unit 1102 and at least one memory 1104. Any suitable processing unit or units can be used. Example processing units include, but are not limited to, a microprocessor, an application specific integrated circuit, and/or a field programmable gate array.

Depending on the configuration and type of the electronic device, the memory 1104 may comprise, but is not limited to, volatile storage (e.g., random access memory), non-volatile storage (e.g., read-only memory), flash memory, or any combination of such memories. The memory 1104 may include a number of program modules and data files, such as an operating system 1106 for controlling the operation of the electronic device 1100, one or more program modules 1108 suitable for parsing received input, determining subject matter of received input, determining actions associated with the input and so on, and one or more other applications 1110.

The electronic device 1100 may have additional features or functionality. For example, the electronic device 1100 may also include additional data storage devices (removable and/or non-removable) such as, for example, magnetic disks, optical disks, or tape. Such additional storage is illustrated in FIG. 11 by a removable storage device 1112 and a non-removable storage device 1114.

The electronic device 1100 may also have one or more input device(s) 1116 such as a keyboard, a trackpad, a mouse, a pen, a sound or voice input device, a touch, force and/or swipe input device, etc. The output device(s) 1118 such as a display, speakers, a printer, etc. may also be included. The aforementioned devices are examples and others may be used. The electronic device 1100 may include one or more communication devices 1120 allowing communications with other electronic devices 1122. Examples of suitable communication devices 1120 include, but are not limited to, cellular, IR, NFC, RF, and/or satellite transmitter, receiver, and/or transceiver circuitry, universal serial bus (USB), parallel, and/or serial ports.

The term computer-readable media as used herein may include computer storage media. Computer storage media may include volatile and nonvolatile, removable and non-removable media implemented in any method or technology for storage of information, such as computer readable instructions, data structures, or program modules.

The memory 1104, the removable storage device 1112, and the non-removable storage device 1114 are all computer storage media examples (e.g., memory storage or memory device) that can include various combinations of the LRD circuits disclosed herein. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 1100. Any such computer storage media may be part of the electronic device 1100. Computer storage media does not include a carrier wave or other propagated or modulated data signal.

The components described in conjunction with the electronic device 1100 may be suitable for any electronic device that includes one or more memory devices.

Figure 12:
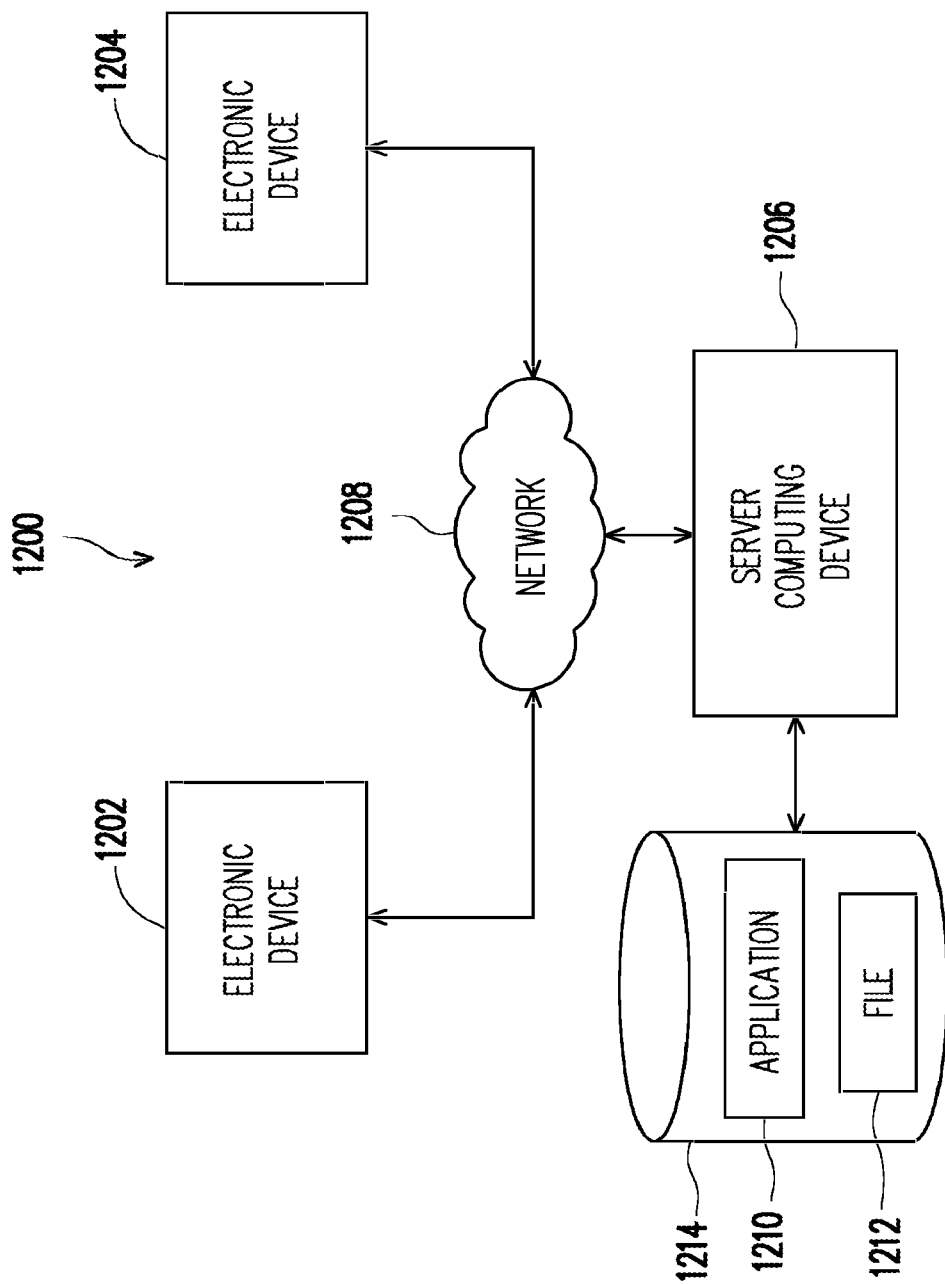
FIG. 12 depicts an example system in which aspects of the disclosure may be practiced in accordance with some embodiments.

FIG. 12 is a block diagram illustrating a system in which aspects of the disclosure may be practiced in accordance with some embodiments. The system 1200 allows a first electronic device 1202 to communicate with a second electronic device 1204. The first and the second electronic devices 1202, 1204 can each transmit and receive signals via wired or wireless communication devices. In some embodiments, the first and the second electronic devices 1202, 1204 may each be a cellular phone, a tablet computing device, or a mobile computing device. The first and the second electronic devices 1202, 1204 can each include the components, or be connected to the components, that are shown associated with the electronic device 1100 in FIG. 11.

The first and the second electronic devices 1202, 1204 are each configured to access or communicate with one or more server computing devices (represented by server computing device 1206) using one or more networks (represented by network 1208). The server computing device 1206 can access or execute one or more applications (represented by application 1210) and/or one or more files (represented by file 1212) stored in one or more storage devices (represented by storage device 1214). The server computing device can include the components, or be connected to the components, that are shown associated with the electronic device 1100 in FIG. 11.

Although FIGS. 2-7 have been described in conjunction with example output signals and input signals, additional or different output signals can ripple to an immediately adjacent set of LRD decoders in other embodiments, and/or different or additional input signals can receive the rippled output signals. For example, in FIG. 6, an output signal HIT2 can ripple from an immediately adjacent set and function as an input signal HIT2 to the NAND circuit 624 in the LRD circuit 602, or the output signal HIT2 in the LRD circuit 606 may function as the input signal HIT2 in the LRD circuit 602. Thus, embodiments are not limited to the output signals and/or input signals discussed herein.

In one aspect, a memory device includes a first column of memory cells and a second column of memory cells. A first local redundancy decoder circuit is operably connected to the first column of memory cells. A second local redundancy decoder circuit is operably connected to the second column of memory cells. The first local redundancy decoder circuit differs from the second local redundancy decoder circuit. For example, the number and/or type of components in the first local redundancy decoder circuit differs from the number and/or type of components in the second local redundancy decoder circuit.

In another aspect, an electronic device includes a processing unit operably connected to a memory device. The memory device includes a first column of memory cells and a second column of memory cells immediately adjacent the first column of memory cells. First local redundancy decoder circuitry is operably connected to the first and the second columns of memory cells. The first local redundancy decoder circuitry includes a first local redundancy decoder circuit and a second local redundancy decoder circuit. The memory device further includes a third column of memory cells and a fourth column of memory cells immediately adjacent the third column of memory cells. Second local redundancy decoder circuitry is operably connected to the third and the fourth columns of memory cells. The second local redundancy decoder circuitry includes the first local redundancy decoder circuit and the second local redundancy decoder circuit. The first local redundancy decoder circuit differs from the second local redundancy decoder circuit. For example, the number and/or type of components in the first local redundancy decoder circuit differs from the number and/or type of components in the second local redundancy decoder circuit.

In yet another aspect, a memory array includes a plurality of memory cells arranged in rows and columns and a first local redundancy decoder circuit is operably connected to a first subset of the columns in the memory array, where a respective first local redundancy decoder circuit is operably connected to every other column in the first subset. A second local redundancy decoder circuit is operably connected to a second subset of the columns in the memory array, where a respective second local redundancy decoder circuit is operably connected to every other column in the second subset. The first and the second local redundancy decoder circuits alternate between the columns. A respective first local redundancy decoder circuit and an immediately adjacent respective second local redundancy decoder circuit form a set such that the memory array includes a plurality of sets. An output signal from the first or the second local redundancy decoder circuits only ripples between immediately adjacent sets and functions as an input signal in the immediately adjacent sets.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A memory device, comprising:
   a first column of memory cells;
   a second column of memory cells immediately adjacent the first column of memory cells;
   a third column of memory cells immediately adjacent the second column of memory cells;
   a first local redundancy decoder circuit operably connected to the first column of memory cells;
   a second local redundancy decoder circuit operably connected to the second column of memory cells, wherein the second local redundancy decoder circuit differs from the first local redundancy decoder circuit; and
   a third local redundancy decoder circuit operably connected to the third column of memory cells, wherein the third local redundancy decoder circuit differs from the first and the second local redundancy decoder circuits.

2. The memory device of claim 1, wherein a number of components in the first local redundancy decoder circuit differs from a number of components in the second local redundancy decoder circuit.

3. The memory device of claim 2, wherein a number of components in the third local redundancy decoder circuit differs from the number of components in the first local redundancy decoder circuit and the number of components in the second local redundancy decoder circuit.

4. The memory device of claim 1, wherein an output signal from the first local redundancy decoder circuit is received as an input signal to the second local redundancy decoder circuit.

5. The memory device of claim 1, wherein an output signal from the first local redundancy decoder circuit is received as an input signal to the third local redundancy decoder circuit.

6. The memory device of claim 1, wherein the first local redundancy decoder circuit comprises a first inverter circuit and a second inverter circuit connected in series.

7. The memory device of claim 1, wherein the second local redundancy decoder circuit comprises:
 an OR circuit;
 a NAND circuit; and
 an inverter circuit, wherein:
  an output of the OR circuit is connected to an input of the NAND circuit; and
  an output of the NAND circuit is connected to an input of the inverter circuit.

8. The memory device of claim 1, wherein the third local redundancy decoder circuit comprises:
 a first transistor, a second transistor, a third transistor, a fourth transistor, a fifth transistor, and a sixth transistor connected in series between a voltage supply and a reference voltage;
 a seventh transistor connected to a first node between the first and the second transistors and a second node between the third and the fourth transistors;
 an eighth transistor connected between the voltage supply and the second node;
 a ninth transistor connected to a third node between the fourth and the fifth transistors and the reference voltage; and
 a tenth transistor connected to a fourth node between the fifth and the sixth transistors and the reference voltage.

9. An electronic device, comprising:
 a processing unit; and
 a memory device operably connected to the processing unit, the memory device comprising:
  a memory array comprising a plurality of memory cells arranged in columns;
  a plurality of first local redundancy decoder circuits operably connected to a first subset of columns in the memory array, wherein a respective first local redundancy decoder circuit is operably connected to a respective column in the first subset of columns;
  a plurality of second local redundancy decoder circuits operably connected to a second subset of columns in the memory array, wherein a respective second local redundancy decoder circuit is operably connected to a respective column in the second subset of columns and each column in the second subset of columns is separate from each column in the first subset of columns; and
  a plurality of third local redundancy decoder circuits operably connected to a third subset of columns in the memory array, wherein a respective third local redundancy decoder circuit is operably connected to a respective column in the third subset of columns and each column in the third subset of columns is separate from each column in the first and in the second subsets of columns.

10. The electronic device of claim 9, further comprises a plurality of fourth local redundancy decoder circuits operably connected to a fourth subset of columns in the memory array, wherein a respective fourth local redundancy decoder circuit is operably connected to a respective column in the fourth subset of columns and each column in the fourth subset of columns is separate from each column in the first, in the second, and in the third subsets of columns.

11. The electronic device of claim 10, wherein the columns in the first subset of columns, in the second subset of columns, in the third subset of columns, and in the fourth subset of columns are interleaved such that a respective column in the first subset is immediately adjacent a respective column in the second subset, the respective column in the second subset is immediately adjacent a respective column in the third subset of columns, and the respective column in the fourth subset is immediately adjacent a respective column in the third subset of columns.

12. The electronic device of claim 9, wherein a number of components in each first local redundancy decoder circuit in the plurality of first local redundancy decoder circuits differs from a number of components in each second local redundancy decoder circuit in the plurality of second local redundancy decoder circuits.

13. The electronic device of claim 9, wherein a number of components in each second local redundancy decoder circuit in the plurality of second local redundancy decoder circuits differs from a number of components in each third local redundancy decoder circuit in the plurality of third local redundancy decoder circuits.

14. The electronic device of claim 9, further comprising a pre-decoder circuit configured to convert a binary code scheme to a different binary code scheme using at least one bit of an N bit input signal, where N is a number equal to or greater than two and the at least one bit does not equal N.

15. The electronic device of claim 14, wherein each remaining bit in the N bit input signal is used as an input signal in the first and second sets.

16. The electronic device of claim 9, wherein each first local redundancy decoder circuit in the plurality of first local redundancy decoder circuits comprises:
 an OR circuit;
 a NAND circuit; and
 an inverter circuit, where:
  an output of the OR circuit is connected to an input of the NAND circuit; and
  an output of the NAND circuit is connected to an input of the inverter circuit.

17. The electronic device of claim 9, wherein each second local redundancy decoder circuit in the plurality of second local redundancy decoder circuits comprises:
 a first transistor, a second transistor, a third transistor, a fourth transistor, a fifth transistor, and a sixth transistor connected in series between a voltage supply and a reference voltage;
 a seventh transistor connected to a first node between the first and the second transistors and a second node between the third and the fourth transistors;
 an eighth transistor connected between the voltage supply and the second node;
 a ninth transistor connected to a third node between the fourth and the fifth transistors and the reference voltage; and
 a tenth transistor connected to a fourth node between the fifth and the sixth transistors and the reference voltage.

18. The electronic device of claim 9, wherein each third local redundancy decoder circuit in the plurality of third local redundancy decoder circuits comprises a first inverter circuit and a second inverter circuit connected in series.

19. The electronic device of claim 9, wherein:
 the first local redundancy decoder circuit, the second local redundancy decoder circuit, and the third local redundancy decoder circuit comprise a first set; and
 an output signal from the first local redundancy decoder circuit, the second local redundancy decoder circuit, or the third local redundancy decoder circuit in the first set is received as an input signal to an immediately adjacent second set.

20. A memory device, comprising:
a first local redundancy decoder circuit operably connected to a first column of memory cells;
a second local redundancy decoder circuit operably connected to a second column of memory cells;
a third local redundancy decoder circuit operably connected to a third column of memory cells; and
a fourth local redundancy decoder circuit operably connected to a fourth column of memory cells, wherein:
 the first local redundancy decoder circuit, the second local redundancy decoder circuit, the third local redundancy decoder circuit, and the fourth local redundancy decoder circuit comprise a first set; and
 an output signal from the first local redundancy decoder circuit, the second local redundancy decoder circuit, the third local redundancy decoder circuit, or the fourth local redundancy decoder circuit in the first set is received as an input signal in an immediately adjacent second set.

* * * * *